(12) United States Patent
Hayashi et al.

(10) Patent No.: US 11,873,398 B2
(45) Date of Patent: Jan. 16, 2024

(54) INTERLAYER INSULATING MATERIAL AND MULTILAYER PRINTED WIRING BOARD

(71) Applicant: SEKISUI CHEMICAL CO., LTD., Osaka (JP)

(72) Inventors: Tatsushi Hayashi, Tsukuba (JP); Takashi Nishimura, Tsukuba (JP); Susumu Baba, Tsukuba (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 639 days.

(21) Appl. No.: 16/336,447

(22) PCT Filed: Sep. 28, 2017

(86) PCT No.: PCT/JP2017/035273
§ 371 (c)(1),
(2) Date: Mar. 25, 2019

(87) PCT Pub. No.: WO2018/062404
PCT Pub. Date: Apr. 5, 2018

(65) Prior Publication Data
US 2021/0284833 A1    Sep. 16, 2021

(30) Foreign Application Priority Data

Sep. 29, 2016    (JP) .................................. 2016-191675

(51) Int. Cl.
*C08L 63/00*    (2006.01)
*B32B 15/20*    (2006.01)
(Continued)

(52) U.S. Cl.
CPC ............ *C08L 63/00* (2013.01); *B32B 15/092* (2013.01); *B32B 15/20* (2013.01); *B32B 27/08* (2013.01);
(Continued)

(58) Field of Classification Search
CPC ...... C08L 63/00; C08L 79/08; C08L 2203/16; C08L 2203/20; H05K 1/0353;
(Continued)

(56) References Cited

U.S. PATENT DOCUMENTS

2008/0075961 A1*    3/2008    Mizori ................. C09J 179/085
428/447
2015/0210884 A1*    7/2015    Hayashi ............... C09D 163/00
174/258

FOREIGN PATENT DOCUMENTS

CN    103289633 A    9/2013
CN    104508760 A    4/2015
(Continued)

OTHER PUBLICATIONS

Machine translation of JP 2016-041797. (Year: 2016).*
(Continued)

*Primary Examiner* — John D Freeman
(74) *Attorney, Agent, or Firm* — Cheng Law Group, PLLC

(57) ABSTRACT

Provided is an interlayer insulating material that can enhance the adhesion between an insulating layer and a metal layer, and can reduce the surface roughness on a surface of the insulating layer. The present invention is an interlayer insulating material used for a multilayer printed wiring board, which contains an epoxy compound, a curing agent, a silica, and a polyimide, and in which the polymide is a reactant of a tetracarboxylic anhydride and a dimer acid diamine, a content of the silica is 30% by weight or more and 90% by weight or less in 100% by weight of components excluding a solvent in the interlayer insulating material, and the total content of the epoxy compound and the curing
(Continued)

agent in 100% by weight of components excluding the silica and a solvent in the interlayer insulating material is 65% by weight or more.

10 Claims, 1 Drawing Sheet

(51) Int. Cl.
  *B32B 27/28* (2006.01)
  *B32B 27/38* (2006.01)
  *H05K 1/02* (2006.01)
  *H05K 1/03* (2006.01)
  *B32B 15/092* (2006.01)
  *B32B 27/08* (2006.01)
  *B32B 27/20* (2006.01)

(52) U.S. Cl.
  CPC ............ *B32B 27/20* (2013.01); *B32B 27/281* (2013.01); *B32B 27/38* (2013.01); *H05K 1/0298* (2013.01); *H05K 1/0353* (2013.01); *B32B 2307/202* (2013.01); *B32B 2307/206* (2013.01); *B32B 2457/08* (2013.01); *C08L 2203/16* (2013.01); *C08L 2203/20* (2013.01); *H05K 2201/0154* (2013.01)

(58) Field of Classification Search
  CPC ......... H05K 1/0298; H05K 2201/0154; H05K 3/4676; H05K 1/0326; H05K 1/0346; H05K 3/46; B32B 15/092; B32B 27/20; B32B 27/38; B32B 15/20; B32B 27/08; B32B 27/281; B32B 2307/206; B32B 2457/08; B32B 2307/202; C08J 5/18; C08J 2479/08; C08J 2463/02; C08J 2379/08; C08J 2363/02; C08G 18/69; C08G 18/7621; C08G 18/797; C08G 59/4014; C08G 59/4042; C08G 59/621; C08G 73/1035; C08G 73/1042; C08G 73/106; C08G 73/1082; C08G 59/686; C08G 73/1007; C08G 59/42; C08K 3/36; C09D 163/00; C09D 175/04
  See application file for complete search history.

(56) References Cited

FOREIGN PATENT DOCUMENTS

| | | | |
|---|---|---|---|
| CN | 106010421 A | 10/2016 | |
| JP | 2010-138361 A | 6/2010 | |
| JP | 2013-001730 A | 1/2013 | |
| JP | 2013-112735 A | 6/2013 | |
| JP | 2015-13950 A | 1/2015 | |
| JP | 2015-117278 A | 6/2015 | |
| JP | 2015117278 A * | 6/2015 | |
| JP | 2015-145498 A | 8/2015 | |
| JP | 2016-027097 A | 2/2016 | |
| JP | 2016041797 A * | 3/2016 | |
| JP | 2016-069651 A | 5/2016 | |
| JP | 2016-191049 A | 11/2016 | |
| JP | 2016194055 A * | 11/2016 | ............ B32B 15/04 |
| JP | 2017-210527 A | 11/2017 | |
| TW | 201402751 A | 1/2014 | |
| TW | 201418312 A | 5/2014 | |
| WO | WO-2010/053185 A1 | 5/2010 | |
| WO | WO-2016/171101 A1 | 10/2016 | |

OTHER PUBLICATIONS

Machine translation of JP 2015-117278. (Year: 2015).*
The First Office Action for the Application No. 201780032797.5 from The State Intellectual Property Office of the People's Republic of China dated May 12, 2021.
Taiwanese Office Action for the Application No. 106133754 dated Jul. 7, 2021.
Written Opinion of the International Searching Authority (PCT/ISA/237) for Application No. PCT/JP2017/035273 dated Dec. 19, 2017 (English Translation dated Apr. 11, 2019).
International Search Report for the Application No. PCT/JP2017/035273 dated Dec. 19, 2017.
Written Opinion of the International Searching Authority (PCT/ISA/237) for Application No. PCT/JP2017/035273 dated Dec. 19, 2017.

* cited by examiner

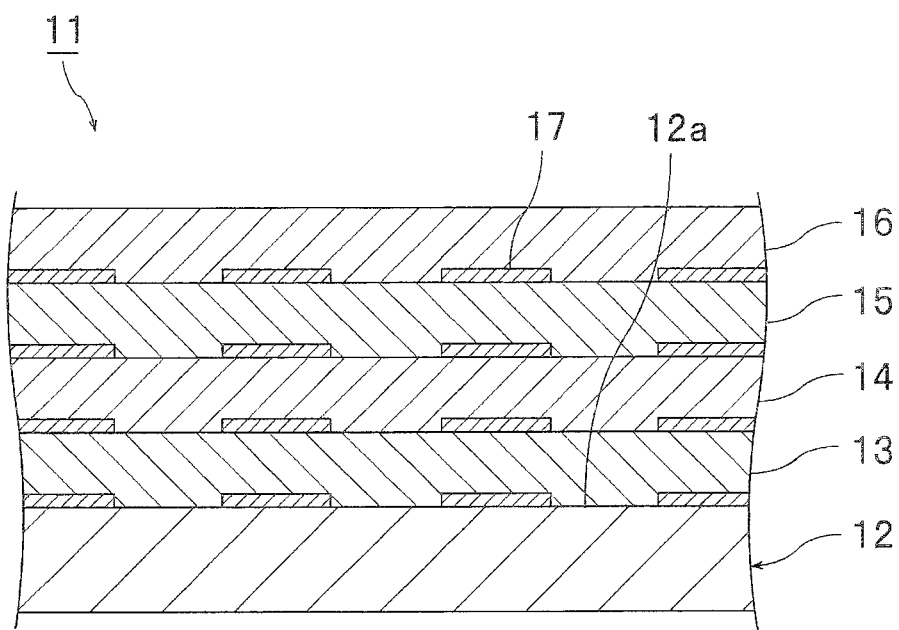

INTERLAYER INSULATING MATERIAL AND MULTILAYER PRINTED WIRING BOARD

TECHNICAL FIELD

The present invention relates to an interlayer insulating material used for a multilayer printed wiring board. In addition, the present invention relates to a multilayer printed wiring board using the above-described interlayer insulating material.

BACKGROUND ART

Conventionally, in order to obtain a laminated board, and an electronic component such as a printed wiring board, various resin compositions have been used. For example, in a multilayer printed wiring board, in order to form an insulating layer for insulating between inside layers or to form an insulating layer positioned in a surface layer part, a resin composition is used. On a surface of the insulating layer, a wiring that is generally a metal is laminated. Further, in order to form an insulating layer, a B-stage film in which the above-described resin composition is formed into a film may be used in some cases. The resin composition and the B-stage film are used for an insulating material for a printed wiring board including a build-up film.

As an example of the above-described resin composition, in the following Patent Document 1, a resin composition containing a polyfunctional epoxy resin (with the proviso that a phenoxy resin is excluded) (A), a phenolic curing agent and/or an active ester-based curing agent (B), a thermoplastic resin (C), an inorganic filler (D), and a quaternary phosphonium-based curing accelerator (E) have been disclosed. As the thermoplastic resin (C), a thermoplastic resin selected from a phenoxy resin, a polyvinylacetal resin, a polyimide, a polyamideimide resin, a polyethersulfone resin, and a polysulfone resin can be mentioned. As the quaternary phosphonium-based curing accelerator (E), one kind or more of quaternary phosphonium-based curing accelerators selected from tetrabutylphosphonium decanoate, (4-methylphenyl)triphenylphosphonium thiocyanate, tetraphenylphosphonium thiocyanate, and butyl triphenylphosphonium thiocyanate can be mentioned.

RELATED ART DOCUMENT

Patent Document

Patent Document 1: JP 2015-145498 A

SUMMARY OF THE INVENTION

Problems to be Solved by the Invention

When an insulating layer is formed by using a resin composition that has been conventionally used as described in Patent Document 1, the adhesion between the insulating layer and wiring (metal layer) may not become sufficiently high in some cases. For this reason, the metal layer may be peeled off from the insulating layer in some cases. Further, the surface roughness on a surface of the insulating layer may be increased.

An object of the present invention is to provide an interlayer insulating material that can enhance the adhesion between an insulating layer and a metal layer, and can reduce the surface roughness on a surface of the insulating layer. In addition, another object of the present invention is to provide a multilayer printed wiring board using the above-described interlayer insulating material.

Means for Solving the Problems

According to a broad aspect of the present invention, an interlayer insulating material used for a multilayer printed wiring board, including an epoxy compound, a curing agent, a silica, and a polyimide, in which the polyimide is a reactant of a tetracarboxylic anhydride and a dimer acid diamine, a content of the silica is 30% by weight or more and 90% by weight or less in 100% by weight of components excluding a solvent in the interlayer insulating material, le and total content of the epoxy compound and the curing agent is 65% by weight or more in 100% by weight of components excluding the silica and a solvent in the interlayer insulating material is provided.

In a certain specific aspect of the interlayer insulating material according to the present invention, the polyimide has a weight average molecular weight of 5000 or more and 100000 or less.

In a certain specific aspect of the interlayer insulating material according to the present invention, a content of the polyimide is 1.5% by weight or more and 50% by weight or less in 100% by weight of components excluding the silica and a solvent in the interlayer insulating material.

In a certain specific aspect of the interlayer insulating material according to the present invention, the polyimide has a functional group capable of being reacted with an epoxy group.

In a certain specific aspect of the interlayer insulating material according to the present invention, the polyimide is a polyimide excluding a polyimide having a siloxane skeleton.

In a certain specific aspect of the interlayer insulating material according to the present invention, a content of the epoxy compound in 100% by weight of components excluding the silica and a solvent in the interlayer insulating material is larger than a content of the polyimide in 100% by weight of components excluding the silica and a solvent in the interlayer insulating material.

In a certain specific aspect of the interlayer insulating material according to the present invention, the curing agent contains an active ester compound.

According to a broad aspect of the present invention, a multilayer printed wiring board, including a circuit board, a plurality of insulating layers arranged on the circuit board, and a metal layer arranged between the plurality of insulating layers, in which the plurality of insulating layers is a cured product of the interlayer insulating material described above is provided.

Effect of the Invention

The interlayer insulating material according to the present invention contains an epoxy compound, a curing agent, a silica, and a polyimide. In the interlayer insulating material according to the present invention, the polyimide is a reactant of a tetracarboxylic acid anhydride and a dimer acid diamine. In the interlayer insulating material according to the present invention, the content of the silica is 30% by weight or more and 90% by weight or less in 100% by weight of components excluding a solvent in the interlayer insulating material. In the interlayer insulating material according to the present invention, the total content of the epoxy compound and the curing agent is 65% by weight or more in 100% by weight of components excluding the silica and a solvent in the interlayer insulating material. In the interlayer insulating material according to the present invention, since the constitution described above is provided, the adhesion between an insulating layer and a metal layer is enhanced and the surface roughness of the insulating layer can be reduced in a multilayer printed wiring board using the interlayer insulating material.

BRIEF DESCRIPTION OF DRAWINGS

FIG. 1 is a sectional view schematically showing a multilayer printed wiring board using the interlayer insulating material according to one embodiment of the present invention.

MODE (S) FOR CARRYING OUT THE INVENTION

Hereinafter, the present invention will be described in detail.

The interlayer insulating material according to the present invention is an interlayer insulating material used for a multilayer printed wiring board. The interlayer insulating material according to the present invention is used for forming an insulating layer in a multilayer printed wiring board. The insulating layer insulates between layers.

The interlayer insulating material according to the present invention contains an epoxy compound, a curing agent, a silica, and a polyimide. The polyimide contained in the interlayer insulating material according to the present invention is a reactant of a tetracarboxylic anhydride and a dimer acid diamine.

In 100% by weight of components excluding a solvent in the interlayer insulating material according to the present invention, the content of the silica is 30% by weight or more and 90% by weight or less. The expression "100% by weight of components excluding a solvent in the interlayer insulating material" means "100% by weight of components excluding a solvent in the interlayer insulating material" when the interlayer insulating material contains the solvent, and means "100% by weight of the interlayer insulating material" when the interlayer insulating material does not contain any solvent.

In 100% by weight of components excluding the silica and a solvent in the interlayer insulating material according to the present invention, the total content of the epoxy compound and the curing agent is 65% by weight or more. The expression "100% by weight of components excluding the silica and a solvent in the interlayer insulating material" means "100% by weight of components excluding the silica and a solvent in the interlayer insulating material" when the interlayer insulating material contains the silica and the solvent, and means "100% by weight of components excluding the solvent in the interlayer insulating material" when the interlayer insulating material contains the solvent but does not contain any silica. The expression "100% by weight of components excluding the silica and a solvent in the interlayer insulating material" means "100% by weight of components excluding the silica in the interlayer insulating material" when the interlayer insulating material contains the silica but does not contain any solvent, and means "100% by weight of the interlayer insulating material" when the interlayer insulating material does not contain any silica and any solvent.

In the present invention, since the constitution described above is provided, the adhesion between an insulating layer and a metal layer is enhanced in a multilayer printed wiring board using the interlayer insulating material. For example, the peel strength of a metal layer to an insulating layer can be enhanced. In particular, using a reactant of a tetracarboxylic anhydride and a dimer acid diamine as a polyimide greatly contributes to the improvement of the adhesion.

In addition, in the present invention, since the constitution described above is provided, the removability (desmear property) of the residue at the bottom of a via can be enhanced at the time of desmear treatment. In particular, using a reactant of a tetracarboxylic anhydride and a dimer acid diamine as a polyimide greatly contributes to the improvement of the desmear property.

Further, in the present invention, since the constitution described above is provided, the surface roughness on a surface of an insulating layer can be reduced. In particular, using a reactant of a tetracarboxylic anhydride and a dimer acid diamine as a polyimide greatly contributes to the reduction of the surface roughness on a surface of an insulating layer.

In addition, in the present invention, since the constitution described above is provided, the dielectric loss tangent can be lowered. In particular, using a reactant of a tetracarboxylic anhydride and a dimer acid diamine as a polyimide greatly contributes to the low dielectric loss tangent.

Further, in the present invention, since the constitution described above is provided, the storage stability of an interlayer insulating material can also be enhanced. In particular, using a reactant of a tetracarboxylic anhydride and a dimer acid diamine as a polyimide greatly contributes to the improvement of the storage stability.

In addition, in the present invention, since the constitution described above is provided, when the interlayer insulating material is made into a film, the uniformity of the film can be enhanced, and further when the interlayer insulating material is cured, the uniformity of the cured product can also be enhanced. In particular, using a reactant of a tetracarboxylic anhydride and a dimer acid diamine as a polyimide greatly contributes to the improvement of the uniformity of the film and the cured product.

Further, in the present invention, since the constitution described above is provided, the content of a silica can be set to 30% by weight or more while maintaining the above characteristics favorably. In particular, as the content of a silica is increased, the adhesion between an insulating layer and a metal layer tends to be lowered and the surface roughness tends to be increased. However, in the present invention, the high adhesion and the small surface roughness both can be achieved.

In the present invention, as described above, an abundance of effects can be obtained by the constitution of the present invention.

In the present invention, the above-described curing agent preferably contains an active ester compound. In this case, the low dielectric loss tangent, the small surface roughness, the low coefficient of thermal expansion, and the high adhesion each can be achieved at an even higher level.

When the above-described interlayer insulating material is heated at 190° C. for 90 minutes to obtain a cured product, the average coefficient of thermal expansion of the cured product at 25° C. or more and 150° C. or less is preferably 30 ppm/° C. or less, and more preferably 25 ppm/° C. or less. When the average coefficient of thermal expansion is the upper limit or less, the cured product has more superior thermal dimensional stability. The dielectric loss tangent of the cured product at a frequency of 1.0 GHz is preferably 0.005 or less, and more preferably 0.004 or less. When the dielectric loss tangent is the upper limit or less, the transmission loss can be further suppressed.

Hereinafter, the details of each component used for the interlayer insulating material according to the present invention, the application of the interlayer insulating material according to the present invention, and the like will be described.

[Epoxy Compound]

The epoxy compound contained in the interlayer insulating material is not particularly limited. As the epoxy compound, a conventionally known epoxy compound can be used. The epoxy compound means an organic compound having at least one epoxy group. As the epoxy compound, only one kind may be used, or two or more kinds may be used in combination.

Examples of the epoxy compound include a bisphenol A-type epoxy resin, a bisphenol F-type epoxy resin, a bisphenol S-type epoxy resin, a phenol novolak-type epoxy resin, a biphenyl-type epoxy resin, a biphenyl novolak-type epoxy resin, a biphenol-type epoxy resin, a naphthalene-type epoxy resin, a fluorene-type epoxy resin, a phenol aralkyl-type epoxy resin, a naphthol aralkyl-type epoxy resin, a dicyclopentadiene-type epoxy resin, an anthracene-type epoxy resin, an epoxy resin having an adamantane skeleton, an epoxy resin having a tricyclodecane skeleton, and an epoxy resin having a triazine nucleus in the skeleton.

The epoxy compound preferably has a biphenyl skeleton, and is preferably a biphenyl-type epoxy resin. When the epoxy resin has a biphenyl skeleton, the adhesion strength between an insulating layer and a metal layer is further enhanced.

The molecular weight of the epoxy compound is more preferably 1000 or less. In this case, even if the content of the silica is 30% by weight or more, and further even if the content of the silica is 60% by weight or more, a resin composition having high flowability can be obtained. For this reason, when an uncured product or B-stage product of a resin composition is laminated on a substrate, the silica can be allowed to be present uniformly.

The molecular weight of the epoxy compound, and the molecular weight of the curing agent described later means a molecular weight calculated from the structural formula when the epoxy compound or curing agent is not a polymer, and when the structural formula of the epoxy compound or curing agent can be specified. Further, when the epoxy compound or curing agent is a polymer, the molecular weight means a weight average molecular weight.

The weight average molecular weight is a weight average molecular weight in terms of polystyrene as measured by gel permeation chromatography (GPC).

[Curing Agent]

The curing agent contained in the above-described interlayer insulating material is not particularly limited. As the curing agent, a conventionally known curing agent can be used. As the curing agent, only one kind may be used, or two or more kinds may be used in combination.

Examples of the curing agent include a cyanate ester compound (cyanate ester curing agent), a phenol compound (phenol curing agent), an amine compound (amine curing agent), a thiol compound (thiol curing agent), an imidazole compound, a phosphine compound, an acid anhydride, an active ester compound, and dicyandiamide. The curing agent preferably has a functional group capable of being reacted with an epoxy group of the epoxy compound.

Examples of the cyanate ester compound include a novolak-type cyanate ester resin, a bisphenol-type cyanate ester resin, and a partially trimerized prepolymer thereof.

Examples of the novolak-type cyanate ester resin include a phenol novolak-type cyanate ester resin, and an alkylphenol-type cyanate ester resin. Examples of the bisphenol-type cyanate ester resin include a bisphenol A-type cyanate ester resin, a bisphenol E-type cyanate ester resin, and tetramethyl bisphenol F-type cyanate ester resin.

Examples of a commercially available product of the cyanate ester compound include a phenol novolak-type cyanate ester resin ("PT-30" and "PT-60" manufactured by Lonza Japan Ltd.), and a trimerized prepolymer of a bisphenol-type cyanate ester resin ("BA-230S", "BA-3000S", "BTP-1000S" and "BTP-6020S" manufactured by Lonza Japan Ltd.).

Examples of the phenol compound include a novolak-type phenol, a biphenol-type phenol, a naphthalene-type phenol, a dicyclopentadiene-type phenol, an aralkyl-type phenol, and a dicyclopentadiene-type phenol.

Examples of a commercially available product of the phenol compound include a novolak-type phenol ("TD-2091" manufactured by DIC Corporation, and "H-4" manufactured by Meiwa Plastic Industries, Ltd.), a biphenyl novolak-type phenol ("MEH-7851" manufactured by Meiwa Plastic Industries, Ltd.), an aralkyl-type phenol compound ("MEH-7800" manufactured by Meiwa Plastic Industries, Ltd.), and a phenol having an aminotriazine skeleton ("LA1356" and "LA3018-50P" manufactured by DIC Corporation).

From the viewpoint of effectively lowering the dielectric loss tangent, of effectively reducing the surface roughness, and of effectively enhancing the adhesion, the curing agent preferably contains an active ester compound. Due to the adequate difference in compatibility between the active ester compound and the dimer acid diamine structural unit constituting a polymer, an extremely fine phase separation structure can be formed after curing, and as a result, excellent adhesion can be obtained even if the surface roughness is small.

The active ester compound means a compound containing at least one ester bond in the structure and having aromatic rings bonded to both sides of the ester bond. The active ester compound can be obtained by condensation reaction of, for example, a carboxylic acid compound or a thiocarboxylic acid compound and a hydroxy compound or a thiol compound. As an example of the active ester compound, a compound represented by the following formula (1) can be mentioned.

[Chemical 1]

(1)

In the formula (1), X1 and X2 each represent a group containing an aromatic ring. Preferable examples of the group containing an aromatic ring include a benzene ring that may have a substituent, and a naphthalene ring that may have a substituent. As the substituent, a hydrocarbon group can be mentioned. The number of carbon atoms of the hydrocarbon group is preferably 12 or less, more preferably 6 or less, and furthermore preferably 4 or less.

As the combination of X1 and X2, the following combinations can be mentioned: a combination of a benzene ring that may have a substituent and a benzene ring that may have a substituent, a combination of a benzene ring that may have a substituent and a naphthalene ring that may have a substituent, and a combination of a naphthalene ring that may have a substituent and a naphthalene ring that may have a substituent.

The above-described active ester compound is not particularly limited. Examples of a commercially available product of the active ester compound include "HPC-8000-65T", "EXB9416-70BK" and "EXB8100L-65T", which are all manufactured by DIC Corporation.

The molecular weight of the curing agent is preferably 1000 or less. In this case, even if the content of the silica is 30% by weight or more, a resin composition having high flowability can be obtained. For this reason, when a B-stage film is laminated on a substrate, the silica can be allowed to be present uniformly.

In 100% by weight of components excluding the silica and a solvent in the interlayer insulating material, the total content of the above-described epoxy compound and the above-described curing agent is preferably 65% by weight or more and more preferably 70% by weight or more, and is preferably 99% by weight or less and more preferably 97% by weight or less. When the total content of the epoxy compound and the curing agent is the lower limit or more and the upper limit or less, an even more favorable cured product can be obtained, and the dimensional change due to the heat of an insulating layer can be further suppressed. The content ratio of the epoxy compound and the curing agent is appropriately selected so that the epoxy compound is cured.

[Polyimide]

The polyimide contained in the above-described interlayer insulating material is a reactant of a tetracarboxylic anhydride and a dimer acid diamine. As the reactant of the tetracarboxylic anhydride and the dimer acid diamine, only one kind may be used, or two or more kinds may be used in combination.

Examples of the tetracarboxylic anhydride include a pyromellitic acid dianhydride, a 3,3',4,4'-benzophenonetetracarboxylic acid dianhydride, a 3,3',4,4'-biphenylsulfonetetracarboxylic acid dianhydride, a 1,4,5,8-naphthalenetetracarboxylic acid dianhydride, a 2,3,6,7-naphthalenetetracarboxylic acid dianhydride, a 3,3',4,4'-biphenylethertetracarboxylic acid dianhydride, a 3,3',4,4'-dimethyldiphenylsilanetetracarboxylic acid dianhydride, a 3,3°,4,4'-tetraphenylsilanetetracarboxylic acid dianhydride, a 1,2,3,4-furantetracarboxylic acid dianhydride, a 4,4'-bis(3,4-dicarboxyphenoxy)diphenyl sulfide dianhydride, a 4,4'-bis(3,4-dicarboxyphenoxy)diphenyl sulfone dianhydride, a 4,4'-bis(3,4-dicarboxyphenoxy)diphenyl propane dianhydride, a 3,3',4,4'-perfluoroisopropylidenediphthalic acid dianhydride, a 3,3',4,4'-biphenyltetracarboxylic acid dianhydride, a bis(phthalic acid)phenylphosphine oxide dianhydride, a p-phenylene-bis(triphenyl phthalic acid) dianhydride, a m-phenylene-bis(triphenyl phthalic acid) dianhydride, a bis(triphenyl phthalic acid)-4,4'-diphenyl ether dianhydride, and a bis(triphenyl phthalic acid)-4,4'-diphenylmethane dianhydride.

Examples of the dimer acid diamine include Versamine 551 (trade name, manufactured by BASF Japan Ltd., 3,4-bis(1-aminoheptyl)-6-hexyl-5-(1-octenyl) cyclohexene), Versamine 552 (trade name, manufactured by Cognis Japan Ltd., a hydrogenated product of Versamine 551), and PRIAMINE 1075 and PRIAMINE 1074 (trade names, both manufactured by Croda Japan EN).

From the viewpoint of effectively enhancing the adhesion between an insulating layer and a metal layer, of further enhancing the storage stability of the interlayer insulating material (resin composition varnish), and of further enhancing the uniformity of the insulating layer, the weight average molecular weight of the polyimide is preferably 5000 or more and more preferably 10000 or more, and is preferably 100000 or less and more preferably 50000 or less.

The weight average molecular weight is a weight average molecular weight in terms of polystyrene as measured by gel permeation chromatography (GPC).

The structure of the terminal or the like of the polyimide is not particularly limited, and the polyimide preferably has a functional group capable of being reacted with an epoxy group. By having such a functional group in the polyimide, the heat resistance of an insulating layer can be further improved. The functional group is preferably an amino group or an acid anhydride group, and is particularly preferably an acid anhydride group. By having an acid anhydride group as the functional group, the increase in melt viscosity can be effectively suppressed even when a polyimide is used. At the time of synthesis of the polyimide, if the amount ratio of the acid anhydride is increased, the terminal can be converted to an acid anhydride group, and if the amount ratio of the amine is increased, the terminal can be converted to an amino group.

From the viewpoint of effectively enhancing the adhesion between an insulating layer and a metal layer, of further enhancing the storage stability of the interlayer insulating material (resin composition varnish), of further enhancing the uniformity of the insulating layer, and of further enhancing the desmear property, the polyimide does not preferably have a siloxane skeleton. The polyimide is preferably a polyimide excluding a polyimide having a siloxane skeleton.

In 100% weight of components excluding the silica and a solvent in the interlayer insulating material, the content of the polyimide is preferably 1.5% by weight or more, more preferably 3% by weight or more, furthermore preferably 5% by weight or more, and particularly preferably 10% by weight or more. In 100% by weight of components excluding the silica and a solvent in the interlayer insulating material, the content of the polyimide is preferably 50% by weight or less, more preferably 45% by weight, furthermore preferably 35 weight or less, and particularly preferably 25% by weight or less.

When the content of the polyimide is the lower limit or more, the desmear property is effectively enhanced, and while the surface roughness on a surface of the insulating layer after the desmearing is suppressed to be small, the adhesion between an insulating layer and a metal layer is effectively increased, and the dielectric loss tangent is further lowered. When the content of the polyimide is the upper limit or less, the storage stability of the interlayer insulating material (resin composition varnish) is further enhanced. In addition, since the uniformity of an insulating layer is further enhanced, the surface roughness on a surface of the insulating layer after the desmearing is further reduced, and the adhesion strength between an insulating layer and a metal layer is further enhanced. Moreover, the coefficient of thermal expansion of an insulating layer is further decreased. Further, an interlayer insulating material or a B-stage film has favorable embeddability to holes or irregularities of a circuit board.

In the interlayer insulating material according to the present invention, the content A of the epoxy compound in 100% by weight of components excluding the silica and a solvent in the interlayer insulating material is preferably larger than the content B of the polyimide in 100% by weight of components excluding the silica and a solvent in the interlayer insulating material. When the interlayer insulating material according to the present invention satisfies the above-described preferred embodiment, the adhesion between an insulating layer and a metal layer can be effectively enhanced, and the storage stability of the interlayer insulating material (resin composition varnish) can be further enhanced. In addition, when the interlayer insulating material according to the present invention satisfies the above-described preferred embodiment, the uniformity of the insulating layer is further enhanced, and therefore, the surface roughness on a surface of the insulating layer after the desmearing can be further reduced, and the coefficient of thermal expansion of the insulating layer can be further decreased. Since these effects are exhibited even more effectively, the content A is preferably larger than the content B by 0.1% by weight or more, more preferably larger than the content B by 1% by weight or more, and furthermore preferably larger than the content B by 3% by weight or more.

[Thermoplastic Resin Other than Polyimide]

The above-described interlayer insulating material may contain a thermoplastic resin other than the polyimide.

Examples of the thermoplastic resin include a polyvinylacetal resin, and a phenoxy resin. As the thermoplastic resin, only one kind may be used, or two or more kinds may be used in combination.

From the viewpoint of effectively lowering the dielectric loss tangent regardless of the curing environment, and of effectively enhancing the adhesion of a metal wiring, the thermoplastic resin is preferably a phenoxy resin. By using a phenoxy resin, the deterioration of the embeddability of a resin film to holes or irregularities of a circuit board and the nonuniformity of a silica can be suppressed. In addition, by using a phenoxy resin, the dispersibility of a silica becomes favorable since the melt viscosity can be adjusted, and further in a curing process, an interlayer insulating material or a B-stage film is hardly wet and spread in an unintended region. The phenoxy resin contained in the interlayer insulating material is not particularly limited. As the phenoxy resin, a conventionally known phenoxy resin can be used. As the phenoxy resin, only one kind may be used, or two or more kinds may be used in combination.

As the phenoxy resin, for example, a phenoxy resin having a skeleton such as a bisphenol A-type skeleton, a bisphenol F-type skeleton, a bisphenol S-type skeleton, a biphenyl skeleton, a novolak skeleton, a naphthalene skeleton, an imide skeleton, or the like can be mentioned.

Examples of a commercially available product of the phenoxy resin include "YP50", "YP55" and "YP70" manufactured by NIPPON STEEL & SUMIKIN CHEMICAL CO., LTD., and "1256B40", "4250", "4256H40", "4275", "YX6954BH30" and "YX8100BH30" manufactured by Mitsubishi Chemical Corporation.

From the viewpoint of obtaining a resin film that is even more excellent in the storage stability, the weight average molecular weight of the thermoplastic resin is preferably 5000 or more and more preferably 10000 or more, and is preferably 100000 or less and more preferably 50000 or less.

The weight average molecular weight of the thermoplastic resin is a weight average molecular weight in terms of polystyrene as measured by gel permeation chromatography (GPC).

The content of the thermoplastic resin is not particularly limited. In 100% by weight of components excluding the silica and a solvent in the interlayer insulating material, the content of the thermoplastic resin (the content of a phenoxy resin when the thermoplastic resin is the phenoxy resin) is preferably 2% by weight or more and more preferably 4% by weight or more, and is preferably 15% by weight or less and more preferably 10% by weight or less. When the content of the thermoplastic resin is the lower limit or more and the upper limit or less, an interlayer insulating material or a B-stage film has favorable embeddability to holes or irregularities of a circuit board. When the content of the thermoplastic resin is the lower limit or more, the interlayer insulating material is even more easily formed into a film, and an even more favorable insulating layer is obtained. When the content of the thermoplastic resin is the upper limit or less, the coefficient of thermal expansion of a cured product is further decreased. Moreover, the surface roughness on a surface of the insulating layer is further reduced, and the adhesion strength between an insulating layer and a metal layer is further enhanced.

[Silica]

The interlayer insulating material contains a silica as an inorganic filler. By using a silica, the dimensional change of a cured product due to heat is further reduced. Further, the dielectric loss tangent of a cured product is further lowered.

From the viewpoint of reducing the surface roughness on a surface of an insulating layer, of further enhancing the adhesion strength between an insulating layer and a metal layer, of forming an even finer wiring on a surface of a cured product, and of imparting the more favorable insulation reliability to a cured product, the silica is furthermore preferably a fused silica. The shape of the silica is preferably spherical.

The average particle diameter of the silica is preferably 10 nm or more, more preferably 50 nm or more and furthermore preferably 150 nm or more, and preferably 20 μm or less, more preferably 10 μm or less, furthermore preferably 5 μm or less and particularly preferably 1 μm or less. When the average particle diameter of the silica is the lower limit or more and the upper limit or less, the size of the pores to be formed by roughening treatment or the like becomes fine and the number of the pores is increased. As a result, the adhesion strength between an insulating layer and a metal layer is further enhanced.

As the average particle diameter of the silica, a value of a median diameter (d50) of 50% is adopted. The average particle diameter can be measured by using a laser diffraction scattering type particle size distribution measuring device.

The silica is preferably spherical, and more preferably a spherical silica. In this case, the surface roughness on a surface of an insulating layer is effectively reduced, and the adhesion strength between the insulating layer and a metal layer is effectively enhanced. When the silica is spherical, the aspect ratio of the silica is preferably 2 or less, and more preferably 1.5 or less.

The silica is preferably surface treated, more preferably a material surface-treated with a coupling agent, and furthermore preferably a material surface-treated with a silane coupling agent. In this way, the surface roughness on a surface of an insulating layer is further reduced, the adhesion strength between an insulating layer and a metal layer is further enhanced, an even finer wiring is formed on a surface of a cured product, and even more favorable inter-wiring insulation reliability and interlayer insulation reliability can be imparted to a cured product.

Examples of the coupling agent include a silane coupling agent, a titanate coupling agent, and an aluminum coupling agent. Examples of the silane coupling agent include methacrylic silane, acrylic silane, amino silane, imidazole silane, vinyl silane, and epoxy silane.

In 100% by weight of components excluding a solvent in the interlayer insulating material, the content of the silica is 30% by weight or more, preferably 40% by weight or more, more preferably 50% by weight or more, and furthermore preferably 60% by weight or more. In 100% by weight of components excluding a solvent in the interlayer insulating material, the content of the silica is 90% by weight or less, preferably 85% by weight or less, more preferably 80% by weight or less, and furthermore preferably 75% by weight or less. When the content of the silica is the lower limit or more and the upper limit or less, the adhesion strength between an insulating layer and a metal layer is further enhanced, and an even finer wiring is formed on a surface of a cured product. In addition, when the content of the silica is the lower limit or more, due to the phase separation after curing with a polyimide using a dimer acid diamine, the silica tends to be unevenly distributed on one side of a sea-island structure in which a polyimide is not contained, and therefore, the coefficient of thermal expansion can be effectively reduced by a combination of a polyimide and a silica, and the dimensional change of a cured product due to heat can be effectively reduced. When 30% by weight or more of a silica is combined with an active ester compound, a particularly high effect can be obtained.

[Curing Accelerator]

The above-described interlayer insulating material preferably contains a curing accelerator. By using a curing accelerator, the curing rate becomes even faster. By rapidly curing a resin film, the number of unreacted functional groups is decreased, and as a result, the crosslinking density is increased. The curing accelerator is not particularly limited, and a conventionally known curing accelerator can be used. As the curing accelerator, only one kind may be used, or two or more kinds may be used in combination.

Examples of the curing accelerator include an imidazole compound, a phosphorus compound, an amine compound, and a metal compound.

Examples of the imidazole compound include 2-undecylimidazole, 2-heptadecyl imidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecyl imidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, a 2-methylimidazole isocyanuric acid adduct, 2-phenyl-4,5-dihydroxy methylimidazole, and 2-phenyl-4-methyl-5-dihydroxymethylimidazole.

As the phosphorus compound, triphenylphosphine and the like can be mentioned.

Examples of the amine compound include diethylamine, triethylamine, diethylenetetramine, triethylenetetramine, and 4,4-dimethylaminopyridine.

Examples of the organometallic compound include zinc naphthenate, cobalt naphthenate, tin octylate, cobalt octylate, cobalt(II) bisacetylacetonate, and cobalt(III) trisacetylacetonate.

The content of the curing accelerator is not particularly limited. In 100% by weight of components excluding the silica and a solvent in the interlayer insulating material, the content of the curing accelerator is preferably 0.01% by weight or more and more preferably 0.9% by weight or more, and is preferably 5.0% by weight or less and more preferably 3.0% by weight or less. When the content of the curing accelerator is the lower limit or more and the upper limit or less, the interlayer insulating material efficiently cures. When the content of the curing accelerator is in the more preferable range, the storage stability of the interlayer insulating material is further enhanced, and an even more favorable cured product can be obtained.

[Solvent]

The interlayer insulating material does not contain any solvent or contains a solvent. By using a solvent, the viscosity of the interlayer insulating material can be controlled within the suitable range, and the coatability of the interlayer insulating material can be enhanced. Further, the solvent may be used for obtaining a slurry containing a silica. As the solvent, only one kind may be used, or two or more kinds may be used in combination.

Examples of the solvent include acetone, methanol, ethanol, butanol, 2-propanol, 2-methoxyethanol, 2-ethoxyethanol, 1-methoxy-2-propanol, 2-acetoxy-1-methoxypropane, toluene, xylene, methyl ethyl ketone, N,N-dimethylformamide, methyl isobutyl ketone, N-methyl-pyrrolidone, n-hexane, cyclohexane, cyclohexanone, and naphtha being a mixture.

Most of the solvent is preferably removed when the interlayer insulating material is formed into a film shape. Therefore, the boiling point of the solvent is preferably 200° C. or less, and more preferably 180° C. or less. The content of the solvent in the interlayer insulating material is not particularly limited. The content of the solvent can be appropriately changed in consideration of the coatability or the like of the interlayer insulating material.

[Other Components]

For the purpose of improving the impact resistance, the heat resistance, the compatibility of a resin, the workability, or the like, a leveling agent, a flame retardant, a coupling agent, a coloring agent, an antioxidant, a UV degradation inhibitor, an antifoaming agent, a thickener, a thixotropy-imparting agent, a thermosetting resin other than epoxy compounds, and the like may also be added in the interlayer insulating material.

Examples of the coupling agent include a silane coupling agent, a titanate coupling agent, and an aluminum coupling agent. Examples of the silane coupling agent include vinyl silane, amino silane, imidazole silane, and epoxy silane.

Examples of other thermosetting resins include polyphenylene ether resin, a divinyl benzyl ether resin, a polyarylate resin, a diallyl phthalate resin, a polyimide, a benzoxazine resin, a benzoxazole resin, a bismaleimide resin, and an acrylate resin.

(Resin Film (B-Stage Film) and Laminated Film)

A resin film (B-stage film) is obtained by forming the above-described interlayer insulating material into a film shape. The resin film is preferably a B-stage film.

From the viewpoint of controlling the curing degree of a resin film even more uniformly, the thickness of the resin film is preferably 5 μm or more, and preferably 200 μm or less.

Examples of the method for forming the interlayer insulating material into a film shape include an extrusion molding method in which by using an extruder, an interlayer insulating material is melt-kneaded, the melt-kneaded material is extruded, and then the extruded material is formed into a film shape by a T-die, a circular die, or the like; a casting molding method in which an interlayer insulating material containing a solvent is cast to be formed into a film shape; and other conventionally known film molding methods. An extrusion molding method or casting molding method is preferred because of achieving the thinning. The film includes a sheet.

By forming the above-described interlayer insulating material into a film shape, and heat-drying the obtained film-shaped interlayer insulating material, for example, at 50° C. to 150° C. for 1 to 10 minutes to such an extent that the curing due to heat does not proceed excessively, a resin film that is a B-stage film can be obtained.

An interlayer insulating material in a film shape, which can be obtained by the drying process as described above, is referred to as a "B-stage film". The B-stage film is a film-shaped interlayer insulating material in a semi-cured state. The semi-cured product is not completely cured, and the curing may further proceed.

The resin film may not be a prepreg. When the resin film is not a prepreg, migration does not occur along glass cloth or the like. Further, when the resin film is laminated or precured, irregularities due to glass cloth do not occur on a surface of the resin film. The interlayer insulating material can be suitably used for forming a laminated film that is provided with a metal foil or a substrate and a resin film laminated on a surface of the a foil or the substrate. The resin film in the laminated film is formed of the interlayer insulating material. The metal foil is preferably a copper foil.

Examples of the substrate of the laminated film include a polyester resin film such as a polyethylene terephthalate film and a polybutylene terephthalate film, an olefin resin film such as a polyethylene film and a polypropylene film, and a polyimide film. The surface of the substrate may be subjected to releasing treatment as needed.

When the above-described interlayer insulating material and the above-described resin film are used for an insulating layer of a circuit, the thickness of the insulating layer formed of the interlayer insulating material or the resin film is preferably the thickness or more of a conductor layer (metal layer) forming a circuit. The thickness of in the insulating layer is preferably 5 or more and preferably 200 µm or less.

(Multilayer Printed Wiring Board)

The above-described interlayer insulating material and the above-described resin film are suitably used for forming an insulating layer in a multilayer printed wiring board.

In addition, the multilayer printed wiring board according to the present invention is provided with a circuit board, multiple insulating layers arranged on the circuit board, and a metal layer arranged between the multiple insulating layers. The insulating layers are a cured product of the interlayer insulating material described above. A metal layer may be arranged on a surface on the outer side of an insulating layer farthest from the circuit board among the multiple insulating layers.

The multilayer printed wiring board can be obtained, for example, by heating and press-molding the resin film.

A metal foil may be laminated on one side or both sides of the resin film. A method for laminating the resin film and a metal foil is not particularly limited, and a known method can be used. For example, the resin film can be laminated on a metal foil while being pressurized with heating or without heating by using a device such as a parallel flat plate press machine or a roll laminator.

In addition, by using a laminated film, the insulating layer of the multilayer printed wiring board may be formed of the resin film of the laminated film. The insulating layer is preferably laminated on a surface of a circuit board, on which a circuit has been provided. Part of the insulating layer is preferably embedded between the circuits.

In the multilayer printed wiring board, a surface of the insulating layer, which is opposite to the surface on which the circuit board has been laminated, is preferably roughening treated.

As the roughening treatment method, a conventionally known roughening treatment method may be used, and the roughening treatment method is not particularly limited. The surface of the insulating layer may be subjected to swelling treatment before the roughening treatment.

FIG. 1 is a sectional view schematically showing a multilayer printed wiring board using the interlayer insulating material according to one embodiment of the present invention.

In the multilayer printed wiring board 11 shown in FIG. 1, a multilayer of insulating layers 13 to 16 is laminated on the upper surface 12a of a circuit board 12. The insulating layers 13 to 16 are a cured product layer. A metal layer 17 is formed in part of the upper surface 12a of the circuit board 12. Among the insulating layers 13 to 16 of a multilayer, for the insulating layers 13 to 15 other than the insulating layer 16 that is positioned on the outer surface opposite to the circuit board 12 side, a metal layer 17 is formed in an area of part of the upper surface of each of the insulating layers 13 to 15. The metal layer 17 is a circuit. Metal layers 17 are respectively arranged between the circuit board 12 and the insulating layer 13, and between two layers adjacent to each other among the insulating layers 13 to 16 that have been laminated. The metal layer 17 on the lower side and the metal layer 17 on the upper side are connected to each other by at least one of a via hole connection and a through hole connection (not shown).

In the multilayer printed wiring board 11, the insulating layers 13 to 16 are formed of the above-described interlayer insulating material. In the present embodiment, since the surfaces of the insulating layers 13 to 16 are roughening treated, fine holes (not shown) are formed on the surfaces of the insulating layers 13 to 16. Further, the metal layer 17 reaches the inside of the fine hole. In addition, in the multilayer printed wiring board 11, the dimension in the width direction (L) of the metal layer 17 and the dimension in the width direction (S) of the part where a metal layer 17 is not formed can be reduced. Further, in the multilayer printed wiring board 11, favorable insulation reliability is imparted between the metal layer on the upper side and the metal layer on the lower side, which are not connected by a via hole connection or a through hole connection (not shown).

(Roughening Treatment and Swelling Treatment)

The above-described interlayer insulating material is preferably used for obtaining a cured product to be subjected to roughening treatment or desmear treatment. The cured product also includes a precured product that can be further cured.

In order to form fine irregularities on a surface of a cured product obtained by precuring the interlayer insulating material, the cured product is preferably subjected to roughening treatment. Before the roughening treatment, the cured product is preferably subjected to swelling treatment. It is preferred that the cured product is subjected to swelling treatment after precuring and before roughening treatment, and further is cured after the roughening treatment. However, the cured product does not necessarily have to be subjected to swelling treatment.

As the method for the swelling treatment, for example, a method in which a cured product is treated with an aqueous solution or an organic solvent dispersion solution of a compound containing ethylene glycol or the like as the main component, or the like is used. The swelling liquid used for the swelling treatment generally contains an alkali as a pH adjusting agent or the like. The swelling liquid preferably contains sodium hydroxide. Specifically, for example, the swelling treatment is performed by treating a cured product at a treatment temperature of 30° C. to 85° C. for 1 to 30 minutes by using a 40% by weight ethylene glycol aqueous solution or the like. The temperature of the swelling treatment is preferably within the range of 50° C. to 85° C. When the temperature of the swelling treatment is extremely low, it takes a long time for the swelling treatment, and the adhesion strength between an insulating layer and a metal layer tends to be lowered.

In the roughening treatment, for example, a chemical oxidizing agent such as a manganese compound, a chromium compound, or a persulfuric acid compound, or the like is used. These chemical oxidizing agents are used as an aqueous solution or an organic solvent dispersion solution after the addition of water or an organic solvent. The roughening liquid used for the roughening treatment generally contains an alkali as a pH adjusting agent or the like. The roughening liquid preferably contains sodium hydroxide.

Examples of the manganese compound include potassium permanganate, and sodium permanganate. Examples of the chromium compound include potassium dichromate, and potassium chromate anhydride. Examples of the persulfuric acid compound include sodium persulfate, potassium persulfate, and ammonium persulfate.

The method for the roughening treatment is not particularly limited. As the method for the roughening treatment, for example, a method in which by using a 30 g/L to 90 g/L permanganic acid or permanganate solution and a 30 g/L to 90 g/L sodium hydroxide solution, a cured product is treated under the condition of a treatment temperature of 30° C. to 85° C. for 1 to 30 minutes is suitable. The temperature of the roughening treatment is preferably within the range of 50° C. to 85° C. The number of times of the roughening treatment is preferably once or twice.

The arithmetic average roughness Ra on a surface of the cured product is preferably 10 nm or more, and is preferably less than 200 nm, more preferably less than 100 nm, and furthermore preferably less than 50 nm. When the arithmetic average roughness Ra is the lower limit or more and the upper limit or less, the conductor loss of an electrical signal can be effectively suppressed, and the transmission loss can be largely suppressed. In addition, an even finer wiring can be formed on a surface of an insulating layer. The arithmetic average roughness Ra is measured in accordance with JIS B 0601 (1994).

(Desmear Treatment)

Through holes may be formed in the cured product obtained by precuring the above-described interlayer insulating material. In the above-described multilayered substrate or the like, a via, a through hole, or the like is formed as a through hole. For example, a via can be formed by irradiation with a laser such as a $CO_2$ laser. The diameter of the via is not particularly limited, and is around 60 μm to 80 μm. Due to the formation of the through hole, a smear, which is a residue of a resin derived from the resin component contained in a cured product, is formed at the bottom of the via in many cases.

In order to remove the smear, the surface of a cured product is preferably subjected to desmear treatment. The desmear treatment may double as the roughening treatment.

In the desmear treatment, as in the case of the roughening treatment, for example, a chemical oxidizing agent such as a manganese compound, a chromium compound, or a persulfuric acid compound, or the like is used. These chemical oxidizing agents are used as an aqueous solution or an organic solvent dispersion solution after the addition of water or an organic solvent. The desmear treatment liquid used for the desmear treatment generally contains an alkali. The desmear treatment liquid preferably contains sodium hydroxide.

The method for the desmear treatment is not particularly limited. As the method for the desmear treatment, for example, a method in which by using a 30 g/L to 90 g/L permanganic acid or permanganate solution and a 30 g/L to 90 g/L sodium hydroxide solution, a cured product is treated once or twice under the condition of a treatment temperature of 30° C. to 85° C. for 1 to 30 minutes is suitable. The temperature of the desmear treatment is preferably within the range of 50° C. to 85° C.

By using the above-described interlayer insulating material, the surface roughness on a surface of the insulating layer to which desmear treatment has been performed is sufficiently reduced.

Hereinafter, the present invention will be specifically described by way of Examples, and Comparative Examples. The present invention is not limited to the following Examples.

(Epoxy Compound)

A biphenyl-type epoxy resin ("NC-3000" manufactured by Nippon Kayaku Co., Ltd.)

A naphthalene-type epoxy resin ("HP-4032D" manufactured by DIC Corporation)

A naphthol aralkyl-type epoxy resin ("ESN-475V" manufactured by NIPPON STEEL & SUMIKIN CHEMICAL CO., LTD.)

A triazine ring-containing epoxy resin ("TEPIC-SP" manufactured by Nissan Chemical Corporation)

A fluorene-type epoxy resin ("PG-100" manufactured by Osaka Gas Chemicals Co., Ltd.)

(Curing Agent)

An active ester resin-containing liquid ("EXB-9416-70BK" manufactured by DIC Corporation, solid content: 70% by weight)

A novolak-type phenol resin ("H-4" manufactured by Meiwa Plastic Industries, Ltd.)

A carbodiimide resin-containing liquid ("V-03" manufactured by Nisshinbo Chemical Inc., solid content: 50% by weight)

A cyanate ester resin-containing liquid ("BA-3000S" manufactured by Lonza Japan Ltd., solid content: 75% by weight)

(Curing Accelerator)

An imidazole compound (2-phenyl-4-methylimidazole, "2P4MZ" manufactured by SHIKOKU CHEMICALS CORPORATION)

Dimethylaminopyridine ("DMAP" manufactured by Wako Pure Chemical Industries, Ltd.)

(Silica)

A silica-containing slurry (silica: 75% by weight, "SC4050-HOA" manufactured by Admatechs Company Limited, average particle diameter: 1.0 μm, aminosilane-treated, cyclohexanone: 25% by weight)

(Thermoplastic Resin)

A phenoxy resin-containing liquid ("YX6954BH30" manufactured by Mitsubishi Chemical Corporation, solid content: 30% by weight)

(Polyimide)

A solution of a polyimide (1) that is a reactant of a tetracarboxylic anhydride and a dimer acid diamine (non-volatile content: 26.8% by weight): synthesized in the following Synthesis Example 1

Synthesis Example 1

Into a reaction vessel equipped with a stirrer, a water divider, a thermometer, and a nitrogen gas introduction pipe, 300.0 g of a tetracarboxylic acid dianhydride ("BisDA-1000" manufactured by SABIC JAPAN LLC.) and 665.5 g of cyclohexanone were placed, and the mixture in the vessel was heated up to 60° C. Next, into the resultant mixture, 89.0 g of dimer diamine ("PRIAMINE 1075" manufactured by Croda Japan KK) and 54.7 g of 1,3-bisaminomethylcyclohexane (manufactured by MITSUBISHI GAS CHEMICAL COMPANY, INC.) were added dropwise. After that, into the resultant mixture, 121.0 g of methylcyclohexane and 423.5 g of ethylene glycol dimethyl ether were placed, the resultant mixture was subjected to imidization reaction at 140° C. over 10 hours, and a solution of a polyimide (1) was obtained (non-volatile content: 26.8% by weight). The molecular weight (weight average molecular weight) of the obtained polyimide (1) was 20000. Further, the mole ratio of acid component/amine component was 1.04.

Gel Permeation Chromatography (GPC) Measurement:

Using a high-performance liquid chromatography system manufactured by Shimadzu Corporation, measurement was performed with the use of tetrahydrofuran (THF) as a developing medium at a column temperature of 40° C. and a flow rate of 1.0 mL/min. As a detector, "SPD-10A" was used, and as a column, two columns of "KF-804L" (having an exclusion limit molecular weight of 400,000) manufactured by Shodex were connected in series and used. As a standard polystyrene, "TSK standard polystyrene" manufactured by TOSOH CORPORATION was used, and a calibration curve was created by using substances each having a weight average molecular weight (Mw) of 354,000, 189,000, 98,900, 37,200, 17,100, 9,830, 5,870, 2,500, 1,050, and 500, and the molecular weight was calculated.

A solution of a polyimide (2) that is a reactant of a tetracarboxylic anhydride and a dimer acid diamine (non-volatile content: 26.8% by weight): synthesized in the following Synthesis Example 2

Synthesis Example 2

Into a reaction vessel equipped with a stirrer, a water divider, a thermometer, and a nitrogen gas introduction pipe, 300.0 g of an aromatic tetracarboxylic acid dianhydride ("BisDA-1000" manufactured by SABIC JAPAN LLC.) and 665.5 g of cyclohexanone were placed, and the mixture in the vessel was heated up to 60° C. Next, into the resultant mixture, 89.0 g of dimer diamine ("PRIAMINE 1075" manufactured by Croda Japan KK) and 54.7 g of 1,3-bisaminomethylcyclohexane (manufactured by MITSUBISHI GAS CHEMICAL COMPANY, INC.) were added dropwise. After that, into the resultant mixture, 121.0 g of methylcyclohexane and 423.5 g of ethylene glycol dimethyl ether were placed, the mixture was subjected to imidization reaction at 140° C. over 16 hours, and a solution of a polyimide (2) was obtained (non-volatile content: 26.8% by weight). The molecular weight (weight average molecular weight) of the obtained polyimide (2) was 60000. Further, the mole ratio of acid component/amine component was 1.04.

A solution of a polyimide (3) that is a reactant of a tetracarboxylic anhydride and a dimer acid diamine (non-volatile content: 20.8% by weight): synthesized in the following Synthesis Example 3

Synthesis Example 3

Into a reaction vessel equipped with a stirrer, a water divider, a thermometer, and a nitrogen gas introduction pipe, 175.0 g of a tetracarboxylic acid dianhydride ("TDA-100" manufactured by New Japan Chemical Co., Ltd.) and 665.5 g of cyclohexanone were placed, and the mixture in the vessel was heated up to 60° C. Next, into the resultant mixture, 89.0 g of dimer diamine ("PRIAMINE 1075" manufactured by Croda Japan KK) and 54.7 g of 1,3-bisaminomethylcyclohexane (manufactured by MITSUBISHI GAS CHEMICAL COMPANY, INC.) were added dropwise. After that, into the resultant mixture, 121.0 g of methylcyclohexane and 423.5 g of ethylene glycol dimethyl ether were placed, the mixture was subjected to imidization reaction at 140° C. over 10 hours, and a solution of a polyimide (3) was obtained (non-volatile content: 20.8% by weight). The molecular weight (weight average molecular weight) of the obtained polyimide (3) was 18000. Further, the mole ratio of acid component/amine component was 1.04.

A solution of a polybutadiene-modified polyimide (4) (non-volatile content: 50.0% by weight): synthesized in the following Synthesis Example 4

Synthesis Example 4

Into a reaction vessel, 50 g of G-3000 (bifunctional hydroxyl group-terminated polybutadiene, number average molecular weight: 3000, manufactured by Nippon Soda Co., Ltd.), 23.5 g of Ipzole 150 (an aromatic hydrocarbon-based mixed solvent manufactured by Idemitsu Petrochemical Co., Ltd.) and 0.005 g of dibutyltin laurate were placed, and mixed and uniformly dissolved. When the mixture became uniform, the temperature was raised to 50° C., and into the resultant mixture, 4.8 g of toluene-2,4-diisocyanate was added while stirring, and the reaction was performed for 3 hours. Next, the reactant was cooled to the room temperature, and then into the reactant, 8.96 g of a benzophenone tetracarboxylic acid dianhydride, 0.07 g of triethylenediamine and 40.4 g of ethyl diglycol acetate (manufactured by Daicel Corporation) were added. While stirring the mixture, the temperature was raised to 130° C., and the reaction was performed for 4 hours. The disappearance of NCO peak at 2250 $cm^{-1}$ was confirmed by Fourier transform infrared spectroscopy (FT-IR). The point of time when the disappearance of NCO peak was confirmed was regarded as the end point of the reaction, and a solution of a polyimide (4) was obtained (non-volatile content: 50.0% by weight). The molecular weight (weight average molecular weight) of the obtained polyimide (4) was 33000.

A solution of a polybutadiene-modified polyimide (5) (non-volatile content: 34.6% by weight): synthesized in the following Synthesis Example 5

Synthesis Example 5

Into a reaction vessel, 20 g of G-1000 (bifunctional hydroxyl group-terminated polybutadiene, number average molecular weight: 1400, manufactured by Nippon Soda Co., Ltd.), 23.5 g of Ipzole 150 (an aromatic hydrocarbon-based mixed solvent manufactured by Idemitsu Petrochemical Co., Ltd.) and 0.005 g of dibutyltin laurate were placed, and mixed and uniformly dissolved. When the mixture became uniform, the temperature was raised to 50° C., and into the resultant mixture, 4.8 g of toluene-2,4-diisocyanate was added while stirring, and the reaction was performed for 3 hours. Next, the reactant was cooled to the room temperature, and then into the reactant, 8.96 g of a benzophenone tetracarboxylic acid dianhydride, 0.07 g of triethylenediamine and 40.4 g of ethyl diglycol acetate (manufactured by Daicel Corporation) were added. While stirring the mixture, the temperature was raised to 130° C., and the reaction was performed for 4 hours. The disappearance of NCO peak at 2250 cm$^{-1}$ was confirmed by FT-IR. The point of time when the disappearance of NCO peak was confirmed was regarded as the end point of the reaction, and a solution of a polyimide (5) was obtained (non-volatile content: 34.6% by weight). The molecular weight (weight average molecular weight) of the obtained polyimide (5) was 28000.

A solution of a siloxane skeleton-containing polyimide (6) (non-volatile content: 46.2% by weight): synthesized in the following Synthesis Example 6

Synthesis Example 6

Into a reaction vessel equipped with a stirrer, a water divider, a thermometer, and a nitrogen gas introduction pipe, 53.00 g of a 3,3',4,4'-benzophenonetetracarboxylic acid dianhydride ("BTDA" manufactured by Daicel Corporation), 185.50 g of cyclohexanone and 37.10 g of methylcyclohexane were placed, and the mixture was heated up to 60° C. Next, into the resultant mixture, 139.17 g of α,ω-bis(3-aminopropyl)polydimethylsiloxane ("KF-8010" manufactured by Shin-Etsu Chemical Co., Ltd.) was gradually added, and then the mixture was heated up to 140° C. to perform imidization reaction over 1 hour, and a solution of a polyimide resin (6) was obtained (non-volatile content: 46.2% by weight). The molecular weight (weight average molecular weight) of the obtained polyimide (6) was 18000.

Examples 1 to 12 and Comparative Examples 1 to 10

The components shown in the following Tables 1 to 3 were mixed in the mixing amounts shown in the following Tables 1 to 3, respectively, and each of the mixtures was stirred at 1200 rpm for 4 hours by using a stirrer, and an interlayer insulating material (resin composition varnish) was obtained.

By using an applicator, the obtained interlayer insulating material (resin composition varnish) was applied on a release-treated surface of a polyethylene terephthalate (PET) film ("XG284" manufactured by Toray Industries, Inc., thickness: 25 μm), and then drying was performed in a gear oven at 100° C. for 2.5 minutes and the solvent was volatilized. In this way, a laminated film having a PET film, and a resin film (B-stage film) that had a thickness of 40 μm and a residual amount of the solvent of 1.0% by weight or more and 3.0% by weight or less on the PET film was obtained.

After that, the laminated film was heated at 190° C. for 90 minutes, and a cured product that is a cured resin film was prepared.

(Evaluation)
(1) Peel Strength (90° Peel Strength)

Both sides of a copper clad laminate (CCL) substrate ("E679FG" manufactured by Hitachi Chemical Co., Ltd.) on which an inner layer circuit had been formed by etching were immersed in a copper surface-roughening agent ("MECetchBOND CZ-8100" manufactured by MEC COMPANY LTD.) to perform roughening treatment on the copper surface. The obtained laminated film was set on both sides of the CCL substrate from the resin film side, and laminated on both sides of the CCL substrate using a diaphragm-type vacuum laminator ("MVLP-500" manufactured by MEIKI Co., Ltd.) to obtain an uncured laminated sample A. The lamination was performed with the depressurization for 20 seconds to have an atmospheric pressure of 13 hPa or less, and then with the pressing for 20 seconds at 100° C. and a pressure of 0.8 MPa.

For the uncured laminated sample A, a PET film was peeled off from a resin film, and the resin film was cured under curing conditions of 180° C. and 30 minutes to obtain a cured laminated sample.

Into a swelling liquid at 80° C. (aqueous solution prepared from "Swelling Dip Securiganth P" manufactured by Atotech Japan K.K. and "sodium hydroxide" manufactured by Wako Pure Chemical Industries, Ltd.), the cured laminated sample was placed, and shaking was performed at a swelling temperature of 80° C. for 10 minutes. After that, washing was performed with pure water.

Into a sodium permanganate roughing solution at 80° C. ("Concentrate Compact CP" manufactured by Atotech Japan K.K." and "sodium hydroxide" manufactured by Wako Pure Chemical Industries, Ltd.), the swelling-treated cured laminated sample was placed, and shaking was performed at a roughening temperature of 80° C. for 30 minutes. After that, with a washing liquid at 25° C. ("Reduction Securiganth P" manufactured by Atotech Japan K.K. and "sulfuric acid" manufactured by Wako Pure Chemical Industries, Ltd.), washing was performed for 2 minutes, and then washing was further performed with pure water. In this way, a roughening-treated cured product was formed on a CCL substrate on which an inner layer circuit had been formed by etching.

A surface of the roughening-treated cured product was treated for 5 minutes with an alkali cleaner at 60° C. ("Cleaner Securiganth 902" manufactured by Atotech Japan K.K.), and degreasing cleaning was performed. After the cleaning, the cured product was treated for 2 minutes with a pre-dipping liquid at 25° C. ("Predip Neoganth B" manufactured by Atotech Japan K.K.). After that, the resultant cured product was treated for 5 minutes with an activator liquid at 40° C. ("Activator Neoganth 834" manufactured by Atotech Japan K.K.), and a palladium catalyst was added on the cured product. Next, the resultant cured product was treated for 5 minutes with a reducing liquid at 30° C. ("Reducer Neoganth WA" manufactured by Atotech Japan K.K.).

Next, the cured product was placed in a chemical copper liquid ("Basic Printoganth MSK-DK", "Copper Printoganth MSK", "Stabilizer Printoganth MSK" and "Reducer Cu" all manufactured by Atotech Japan K.K.), and electroless plating was performed until the plating thickness reached around 0.5 μm. After the electroless plating, in order to remove the residual hydrogen gas, annealing was performed at a temperature of 120° C. for 30 minutes. All of the processes up to the electroless plating process were performed while shaking the cured product, with the treating liquids set to 2 L on a beaker scale.

Next, electrolytic plating was performed on the cured product to which the electroless plating had been performed, until the plating thickness reached 25 μm. As the electrolytic copper plating, a copper sulfate solution ("copper sulfate pentahydrate" manufactured by Wako Pure Chemical Industries, Ltd., "sulfuric acid" manufactured by Wako Pure Chemical Industries, Ltd., "Basic Leveler Cupracid HL" manufactured by Atotech Japan K.K. and "Correction Agent Cupracid GS" manufactured by Atotech Japan K.K.) was used, and the electrolytic plating was performed by applying a current of 0.6 A/cm$^2$ until the plating thickness reached around 25 μm. After the copper plating treatment, the cured product was heated at 190° C. for 90 minutes to be further cured. In this way, a cured product having a copper plating layer laminated on the upper surface of the cured product was obtained.

For the obtained cured product having a copper plating layer laminated on the cured product, a 10-mm wide notch was made on a surface of the copper plating layer. After that, by using a tensile testing machine ("AG-5000B" manufactured by Shimadzu Corporation), the adhesion strength (90° peel strength) between the cured product (insulating layer) and the metal layer (copper plating layer) was measured under the condition of a crosshead speed of 5 mm/minute. The peel strength was evaluated by the following criteria.

[Criteria for Evaluation of Peel Strength]
◯◯: peel strength is 0.5 kgf/cm or more
◯: peel strength is 0.4 kgf/cm or more and less than 0.5 kgf/cm
x: peel strength is less than 0.4 kgf/cm (2) Dielectric Loss Tangent The obtained resin film was cut into sheets each having a size of 2 mm in width and 80 mm in length, and five sheets were superimposed to obtain a laminated body having a thickness of 200 μm. The obtained laminated body was heated at 190° C. for 90 minutes, and a cured body was obtained. For the obtained cured body, by using a "cavity resonance perturbation method dielectric constant measuring device CP521" manufactured by Kanto Electronic Application and Development Inc. and a "network analyzer N5224A PNA" manufactured by Keysight Technologies Inc., the dielectric loss tangent was measured at a frequency of 1.0 GHz and at room temperature (23° C.) by a cavity resonance method.

(3) Storage Stability of Interlayer Insulating Material

The obtained interlayer insulating material (resin composition varnish) was stored at 25° C. for 5 days. The interlayer insulating material after the storage was visually observed. The storage stability of the interlayer insulating material was evaluated by the following criteria.

[Criteria for Evaluation of Storage Stability of Interlayer Insulating Material]
◯◯: no separation
◯: slightly separated (on a level with no problem in practical use)
x: separated (on a level with a problem in practical use)

(4) Uniformity of Cured Product

The cross section of the obtained cured product was observed with a scanning electron microscope (SEM) at a magnification of 1500 times in a reflection electron mode, and the presence or absence of phase separation within 3200 μm$^2$ was evaluated. The uniformity of the cured product was evaluated by the following criteria.

[Criteria for Evaluation of Uniformity of Cured Product]
◯◯: no phase separation exceeding 3 μm
◯: one or More of phase separations of 3 μm or more and 5 μm or less, and no phase separation exceeding 5 μm
x: one or more of phase separations exceeding 5 μm (5) Average Coefficient of Thermal Expansion (CTE)

The obtained cured product (using a resin film having a thickness of 40 μm) was cut into pieces each having a size of 3 mm×25 mm. By using a thermomechanical analyzer ("EXSTAR TMA/SS6100" manufactured by SII Nano Technology Inc.), the average coefficient of thermal expansion (ppm/° C.) in the range of 25° C. to 150° C. of the cut cured product was calculated under the conditions of a tensile load of 33 mN and a temperature rise rate of 5° C./min. The average coefficient of thermal expansion was evaluated by the following criteria.

[Evaluation Criteria of Average Coefficient of Thermal Expansion]
◯◯: the average coefficient of thermal expansion is ppm/° C. or less
◯: the average coefficient of thermal expansion is exceeding 25 ppm/° C. and 30 ppm/° C. or less
x: the average coefficient of thermal expansion is exceeding 30 ppm/° C.

(6) Desmear Property (Removability of Residue on the Bottom of Via)

Laminate·Semi-Curing Treatment:

The obtained resin film was vacuum-laminated on a CCL substrate ("E679FG" manufactured by Hitachi Chemical Co., Ltd.), and the vacuum-laminated resin film was heated at 180° C. for 30 minutes so as to be semi-cured. In this way, a laminated body A in which a semi-cured product of a resin film was laminated on a CCL substrate was obtained.

Via (Through Hole) Formation:

In the semi-cured product of a resin film, which is the obtained laminated body A, a via (through hole) having a diameter of 60 μm at the upper end and a diameter of 40 μm at the lower end (bottom) was formed by using a $CO_2$ laser (manufactured by Hitachi Via Mechanics, Ltd.). In this way, a laminated body B in which a semi-cured product of a resin film was laminated on a CCL substrate, and a via (through hole) was formed in the semi-cured product of a resin film was obtained.

Removal Treatment of Residue at the Bottom of Via:

(a) Swelling Treatment

Into a swelling liquid at 80° C. ("Swelling Dip Securiganth P" manufactured by Atotech Japan K.K.), the obtained laminated body B was placed, and shaking was performed for 10 minutes. After that, washing was performed with pure water.

(b) Permanganate Treatment (Roughening Treatment and Desmear Treatment)

Into a roughing solution of potassium permanganate at 80° C. ("Concentrate Compact CP" manufactured by Atotech Japan K.K.), a laminated body B after swelling treatment was placed, and shaking was performed for 30 minutes. Next, by using a washing liquid at 25° C. ("Reduction Securiganth P" manufactured by Atotech Japan K.K.), treatment was performed for 2 minutes, and then washing was performed with pure water to obtain an evaluation sample 1.

The bottom of a via of an evaluation sample 1 was observed with a scanning electron microscope (SEM), and the maximum smear length from a wall surface of the bottom of the via was measured. The removability of the residue on the bottom of the via was evaluated by the following criteria.

[Criteria for Evaluation of Removability of Residue on the Bottom of Via]
◯◯: the maximum smear length is less than 2 μm
◯: the maximum smear length is 2 μm or more and less than 3 μm
x: the maximum smear length is 3 μm or more (7) Surface Roughness (Arithmetic Average Roughness Ra)

For the surface of the roughening-treated cured product obtained in the evaluation of the (1) 90° peel strength, an arithmetic average roughness Ra was measured in the measurement area of 94 μm×123 μm by using a non-contact three-dimensional surface shape measuring device ("WYKO NT1100" manufactured by Veeco Instruments Inc.). The surface roughness was evaluated by the following criteria.

[Criteria for Evaluation of Surface Roughness]

◯◯: Ra is less than 50 nm

◯: Ra is 50 nm or more and less than 200 nm x: Ra is 200 nm or more

The compositions and the results are shown in the following Tables 1 to 6.

TABLE 1

| | | Example 1 | Example 2 | Example 3 | Example 4 | Example 5 | Comparative Example 1 | Comparative Example 2 | Comparative Example 3 | Comparative Example 4 | Example 10 | Comparative Example 5 | Example 11 | Example 12 | Comparative Example 10 |
|---|---|---|---|---|---|---|---|---|---|---|---|---|---|---|---|
| Content (% by weight) of silica in 100% by weight of components excluding solvent in interlayer insulating material | SC4050-HOA | 70.0 | 70.0 | 70.0 | 70.0 | 70.0 | 70.0 | 70.0 | 70.0 | 70.0 | 70.0 | 25.0 | 70.0 | 70.0 | 70.0 |
| Content (% by weight) of components excluding silica in 100% by weight of components excluding solvent in interlayer insulating material | | 30.0 | 30.0 | 30.0 | 30.0 | 30.0 | 30.0 | 30.0 | 30.0 | 30.0 | 30.0 | 75.0 | 30.0 | 30.0 | 30.0 |
| Content (% by weight) of polyimide in 100% by weight of components excluding silica and solvent in interlayer insulating material | Synthesis Example 1 | 1.5 | 6.0 | 9.0 | | | | | | | 15.0 | 15.0 | 20.0 | 30.0 | 35.0 |
| | Synthesis Example 2 | | | | 6.0 | | | | | | | | | | |
| | Synthesis Example 3 | | | | | | | | 6.0 | | | | | | |
| | Synthesis Example 4 | | | | | | | 6.0 | | | | | | | |
| | Synthesis Example 5 | | | | | 6.0 | | | | | | | | | |
| | Synthesis Example 6 | | | | | | | | | 6.0 | | | | | |
| Content (% by weight) of each component in 100% by weight of components excluding silica, solvent and polyimide in interlayer insulating material | Epoxy compound NC-3000 | 24.7 | 24.7 | 24.7 | 24.7 | 24.7 | 24.7 | 24.7 | 24.7 | 24.7 | 24.7 | 24.7 | 24.7 | 24.7 | 24.7 |
| | HP-4032D | 5.2 | 5.2 | 5.2 | 5.2 | 5.2 | 5.2 | 5.2 | 5.2 | 5.2 | 5.2 | 5.2 | 5.2 | 5.2 | 5.2 |
| | TEPIC-SP | 3.6 | 3.6 | 3.6 | 3.6 | 3.6 | 3.6 | 3.6 | 3.6 | 3.6 | 3.6 | 3.6 | 3.6 | 3.6 | 3.6 |
| | PG-100 | 14.2 | 14.2 | 14.2 | 14.2 | 14.2 | 14.2 | 14.2 | 14.2 | 14.2 | 14.2 | 14.2 | 14.2 | 14.2 | 14.2 |
| | EXB-9416-70BK | 48.0 | 48.0 | 48.0 | 48.0 | 48.0 | 48.0 | 48.0 | 48.0 | 48.0 | 48.0 | 48.0 | 48.0 | 48.0 | 48.0 |
| | Curing agent H-4 | 3.8 | 3.8 | 3.8 | 3.8 | 3.8 | 3.8 | 3.8 | 3.8 | 3.8 | 3.8 | 3.8 | 3.8 | 3.8 | 3.8 |
| | Curing accelerator DMAP | 0.5 | 0.5 | 0.5 | 0.5 | 0.5 | 0.5 | 0.5 | 0.5 | 0.5 | 0.5 | 0.5 | 0.5 | 0.5 | 0.5 |
| Total content (% by weight) of epoxy compound and curing agent in 100% by weight of components excluding silica and solvent in interlayer insulating material | | 98.0 | 93.5 | 90.5 | 93.5 | 93.5 | 99.5 | 93.5 | 93.5 | 93.5 | 84.6 | 84.6 | 79.6 | 69.7 | 64.7 |

TABLE 2

|  |  | Example 6 | Example 7 | Comparative Example 6 | Comparative Example 7 |
|---|---|---|---|---|---|
| Content (% by weight) of silica in 100% by weight of components excluding solvent in interlayer insulating material | SC4050-HOA | 72.0 | 72.0 | 72.0 | 72.0 |
| Content (% by weight) of components excluding silica in 100% by weight of components excluding solvent in interlayer insulating material |  | 28.0 | 28.0 | 28.0 | 28.0 |
| Content (% by weight) of polyimide in 100% by weight of components excluding silica and solvent in interlayer insulating material | Synthesis Example 1 | 5.6 |  |  |  |
|  | Synthesis Example 2 |  | 5.6 |  |  |
|  | Synthesis Example 4 |  |  |  | 5.6 |
| Content (% by weight) of each component in 100% by weight of components excluding silica, solvent and polyimide in interlayer insulating material | Epoxy compound NC-3000 | 34.9 | 34.9 | 34.9 | 34.9 |
|  | HP-4032D | 12.2 | 12.2 | 12.2 | 12.2 |
|  | ESN-475V | 8.2 | 8.2 | 8.2 | 8.2 |
|  | Curing agent V-03 | 39.4 | 39.4 | 39.4 | 39.4 |
|  | H-4 | 3.4 | 3.4 | 3.4 | 3.4 |
|  | Curing accelerator 2P4MZ | 2.0 | 2.0 | 2.0 | 2.0 |
| Total content (% by weight) of epoxy compound and curing agent in 100% by weight of components excluding silica and solvent in interlayer insulating material |  | 92.5 | 92.5 | 98.0 | 92.5 |

TABLE 3

|  |  | Example 8 | Example 9 | Comparative Example 8 | Comparative Example 9 |
|---|---|---|---|---|---|
| Content (% by weight) of silica in 100% by weight of components excluding solvent in interlayer insulating material | SC4050-HOA | 72.0 | 72.0 | 72.0 | 72.0 |
| Content (% by weight) of components excluding silica in 100% by weight of components excluding solvent in interlayer insulating material |  | 28.0 | 28.0 | 28.0 | 28.0 |
| Content (% by weight) of polyimide in 100% by weight of components excluding silica and solvent in interlayer insulating material | Synthesis Example 1 | 5.4 |  |  |  |
|  | Synthesis Example 2 |  | 5.4 |  |  |
|  | Synthesis Example 4 |  |  |  | 5.4 |
| Content (% by weight) of each component in 100% by weight of components excluding silica, solvent and polyimide in interlayer insulating material | Epoxy compound NC-3000 | 33.9 | 33.9 | 33.9 | 33.9 |
|  | HP-4032D | 10.4 | 10.4 | 10.4 | 10.4 |
|  | ESN-475V | 13.9 | 13.9 | 13.9 | 13.9 |
|  | PG-100 | 10.8 | 10.8 | 10.8 | 10.8 |
|  | Curing agent BA-3000S | 24.4 | 24.4 | 24.4 | 24.4 |
|  | Curing accelerator 2P4MZ | 1.9 | 1.9 | 1.9 | 1.9 |
|  | Thermoplastic resin YX6954BH30 | 4.8 | 4.8 | 4.8 | 4.8 |
| Total content (% by weight) of epoxy compound and curing agent in 100% by weight of components excluding silica and solvent in interlayer insulating material |  | 88.3 | 88.3 | 93.4 | 88.3 |

TABLE 4

|  |  | Example 1 | Example 2 | Example 3 | Example 4 | Example 5 | Comparative Example 1 | Comparative Example 2 |
|---|---|---|---|---|---|---|---|---|
| Evaluation | Peel strength | ◯ | ◯◯ | ◯◯ | ◯ | ◯◯ | x | ◯◯ |
|  | Dielectric loss tangent | 3.9 | 3.6 | 3.2 | 3.6 | 3.5 | 4.3 | 3.7 |

TABLE 4-continued

|  | | | | | | | |
|---|---|---|---|---|---|---|---|
| Storage stability | ⊚ | ⊚ | ⊚ | ⊚ | ⊚ | ⊚ | ○ |
| Uniformity of cured product | ⊚ | ⊚ | ⊚ | ⊚ | ⊚ | ⊚ | ○ |
| Average coefficient of thermal expansion (CTE) | ⊚ | ⊚ | ○ | ⊚ | ⊚ | ○ | x |
| Desmear property | ○ | ⊚ | ⊚ | ⊚ | ⊚ | x | ⊚ |
| Surface roughness | ⊚ | ⊚ | ○ | ○ | ○ | ⊚ | x |

|  |  | Comparative Example 3 | Comparative Example 4 | Comparative Example 5 | Example 10 | Example 11 | Example 12 | Comparative Example 10 |
|---|---|---|---|---|---|---|---|---|
| Evaluation | Peel strength | x | x | x | ⊚ | ⊚ | ⊚ | ⊚ |
|  | Dielectric loss tangent | 4.2 | 4.2 | 6.5 | 3.0 | 2.8 | 2.5 | 2.3 |
|  | Storage stability | ⊚ | x | ⊚ | ⊚ | ○ | ○ | x |
|  | Uniformity of cured product | ⊚ | x | ⊚ | ⊚ | ⊚ | ○ | ○ |
|  | Average coefficient of thermal expansion (CTE) | ○ | ⊚ | x | ○ | ○ | ○ | x |
|  | Desmear property | ○ | x | x | ⊚ | ⊚ | ⊚ | ⊚ |
|  | Surface roughness | ○ | ⊚ | ⊚ | ○ | ○ | ○ | x |

TABLE 5

|  |  | Example 6 | Example 7 | Comparative Example 6 | Comparative Example 7 |
|---|---|---|---|---|---|
| Evaluation | Peel strength | ⊚ | ⊚ |  | ⊚ |
|  | Dielectric loss tangent | 6.8 | 6.6 | 7.4 | 6.8 |
|  | Storage stability | ⊚ | ⊚ | ⊚ | X |
|  | Uniformity of cured product | ⊚ | ⊚ | ⊚ | ○ |
|  | Average coefficient of thermal expansion (CTE) | ○ | ○ | X | X |
|  | Desmear property | ⊚ | ⊚ | ○ | ⊚ |
|  | Surface roughness | ○ | ○ | ○ | X |

TABLE 6

|  |  | Example 8 | Example 9 | Comparative Example 8 | Comparative Example 9 |
|---|---|---|---|---|---|
| Evaluation | Peel strength | ○ | ○ | X | ○ |
|  | Dielectric loss tangent | 6.6 | 6.5 | 7.3 | 6.5 |
|  | Storage stability | ⊚ | ⊚ | ⊚ | ⊚ |
|  | Uniformity of cured product | ⊚ | ⊚ | ⊚ | ○ |
|  | Average coefficient of thermal expansion (CTE) | ○ | ○ | ○ | ○ |
|  | Desmear property | ⊚ | ⊚ | ○ | ○ |
|  | Surface roughness | ○ | ○ | ○ | X |

EXPLANATION OF SYMBOLS

11: multilayer printed wiring board
12: circuit board
12a: upper surface
13 to 16: insulating layer
17: metal layer

The invention claimed is:
1. An interlayer insulating material capable of being used in a multilayer printed wiring board, comprising:
an epoxy compound;
a curing agent;
a silica;
a polyimide; and
optionally, a solvent,
the epoxy compound containing an epoxy compound having a biphenyl skeleton,
the curing agent containing an active ester compounds,
the polyimide being a reactant of a tetracarboxylic anhydride and a dimer acid diamine, the polyimide having an amino group at the terminal thereof or an acid anhydride group at the terminal thereof, a content of the silica being 60% by weight or more and 90% by weight or less in 100% by weight of components excluding any solvent in the interlayer insulating material, a total content of the epoxy compound and the curing agent being 65% by weight or more in 100% by weight of components excluding the silica and any solvent in the interlayer insulating material, and a content of the epoxy compound in 100% by weight of components excluding the silica and any solvent in the interlayer insulating material being larger than a content of the polyimide in 100% by weight of components excluding the silica and any solvent in the interlayer insulating material.

2. The interlayer insulating material according to claim 1, wherein the polyimide has a weight average molecular weight of 5000 or more and 100000 or less.

3. The interlayer insulating material according to claim 1, wherein the content of the polyimide in 100% by weight of components excluding the silica and any solvent in the interlayer insulating material is 1.5% by weight or more and 50% by weight or less.

4. The interlayer insulating material according to claim 1, wherein the polyimide has a functional group capable of being reacted with an epoxy group.

5. The interlayer insulating material according to claim 1, wherein the polyimide is a polyimide excluding a polyimide having a siloxane skeleton.

6. A multilayer printed wiring board, comprising:

a circuit board;

a plurality of insulating layers arranged on the circuit board; and a metal layer arranged between the plurality of insulating layers, the plurality of insulating layers being a cured product of the interlayer insulating material according to claim 1.

7. The interlayer insulating material according to claim 1, further comprising a silane coupling agent selected from the group consisting of vinyl silane, amino silane, imidazole silane, and epoxy silane.

8. The interlayer insulating material according to claim 1, further comprising a flame retardant.

9. The interlayer insulating material according to claim 1, further comprising a thermosetting resin other than an epoxy compound, the thermosetting resin other than an epoxy compound being selected from the group consisting of a polyphenylene ether resin, a divinyl benzyl ether resin, a polyarylate resin, a diallyl phthalate resin, a benzoxazine resin, a benzoxazole resin, and a bismaleimide resin.

10. The interlayer insulating material according to claim 1, further comprising an anti foaming agent.

* * * * *